United States Patent [19]

Huang et al.

[11] Patent Number: 5,369,594
[45] Date of Patent: Nov. 29, 1994

[54] CONJUGATE GRADIENT METHOD IN COMPUTER-AIDED CIRCUIT DESIGN

[75] Inventors: Ching-Chao Huang, Hopewell Junction; Richard D. Kimmel, Wappingers Falls, both of N.Y.

[73] Assignee: International Business Machines Corporation, Armonk, N.Y.

[21] Appl. No.: 900,976

[22] Filed: Jun. 18, 1992

[51] Int. Cl.$^5$ .............................................. G06F 15/60
[52] U.S. Cl. .................................... 364/489; 364/490; 364/491
[58] Field of Search ................ 364/578, 488, 489, 490, 364/491

[56] References Cited

U.S. PATENT DOCUMENTS

| | | | |
|---|---|---|---|
| 4,914,612 | 4/1990 | Beece et al. | 364/578 |
| 4,916,647 | 4/1990 | Catlin | 364/578 |
| 4,918,643 | 4/1990 | Wong | 364/802 |
| 4,939,681 | 7/1990 | Yokomizo et al. | 364/578 |
| 4,945,503 | 7/1990 | Takasaki | 364/578 |
| 4,982,361 | 1/1991 | Miyaoka et al. | 364/900 |
| 5,050,091 | 9/1991 | Rubin | 364/488 |
| 5,206,822 | 4/1993 | Taylor | 364/736 |
| 5,210,699 | 5/1993 | Harrington | 364/488 |

OTHER PUBLICATIONS

Giuseppe Radicati di Brozolo et al., Conjugate-gradient subroutines for the IBM 3090 Vector Facility, J. Res. Develop, Mar. 1989.

Paul Debefve et al., Waveform Techniques, Circuit Analysis, Simulation and Design, 1987.

Ch. H. Carlin et al., On Partitioning for Waveform Relaxation Time-Domain Analysis of VLSI Circuits, IEEE, 1984.

Chung-Wen Ho et al., The Modified Nodal Approach to Network Analysis, IEEE, vol. Cas-22, No. 6, Jun. 1975.

*Primary Examiner*—Thomas G. Black
*Assistant Examiner*—Stephen J. Walder, Jr.
*Attorney, Agent, or Firm*—Whitham, Curtis, Whitham & McGinn

[57] ABSTRACT

The present invention relates to an improved method for computer-aided electrical circuit simulation which combines circuit partitioning, modified nodal formulation and conjugate-gradient solution method to efficiently analyze large electrical circuit networks. Circuit partitioning is used to create sub-circuits which isolate the passive elements of the electrical circuit. Modified nodal formulation is used to formulate matrices representative of the resultant sub-circuits. All matrices resulting from the sub-circuits containing only passive elements will be positive-definite symmetric and are efficiently solved using conjugate gradient method. Conjugate-gradient method is known to be an extremely efficient method for solving matrices of this type.

5 Claims, 4 Drawing Sheets

FIG. 2a
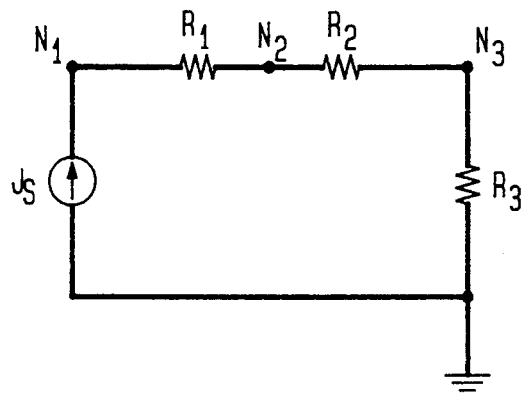
FIG. 2b
$$\begin{bmatrix} G_1 & -G_1 & 0 \\ -G_1 & (G_1+G_2) & -G_2 \\ 0 & -G_2 & (G_2+G_3) \end{bmatrix} \begin{bmatrix} N_1 \\ N_2 \\ N_3 \end{bmatrix} = \begin{bmatrix} J_S \\ 0 \\ 0 \end{bmatrix}$$
FIG. 3a
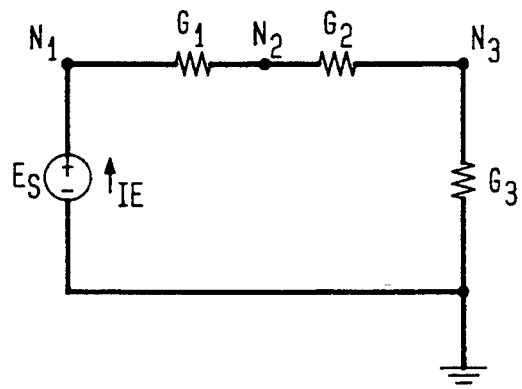
FIG. 3b
$$\begin{bmatrix} G_1 & -G_1 & 0 & -1 \\ -G_1 & (G_1+G_2) & -G_2 & 0 \\ 0 & -G_2 & (G_2+G_3) & 0 \\ 1 & 0 & 0 & 0 \end{bmatrix} \begin{bmatrix} N_1 \\ N_2 \\ N_3 \\ I_E \end{bmatrix} = \begin{bmatrix} 0 \\ 0 \\ 0 \\ E_S \end{bmatrix}$$

$$\begin{bmatrix} G_1 & -1 \\ 1 & 0 \end{bmatrix} \begin{bmatrix} N_1 \\ I_E \end{bmatrix} = \begin{bmatrix} G_1 N_2 \\ E_S \end{bmatrix}$$

$$\begin{bmatrix} (G_1+G_2) & -G_2 \\ -G_2 & (G_2+G_3) \end{bmatrix} \begin{bmatrix} N_2 \\ N_3 \end{bmatrix} = \begin{bmatrix} G_1 N_1 \\ 0 \end{bmatrix}$$

CONJUGATE GRADIENT METHOD IN COMPUTER-AIDED CIRCUIT DESIGN

BACKGROUND OF THE INVENTION

1. Field of the Invention

The present invention generally relates to an improved method and apparatus for computer-aided electrical circuit design through circuit simulation and, more particularly, to a method and apparatus that combines circuit partitioning and modified nodal formulation to formulate matrices having particular properties which involve solution methods specialized to those properties.

2. Description of the Prior Art

Computer-aided electrical circuit simulators are a vital engineering tool. They apply the vast computational power of the computer to the analysis of very complicated circuits which would be tedious if not impossible to solve by hand.

Many techniques have been developed to make computer-aided simulation of large circuits more efficient. Most early computer-aided circuit simulators rely on classic nodal formulation to model the electrical circuits. Classic nodal formulation is based on Kirchhoff's Current Law (KCL) wherein the voltage at each node within the circuit is solved for by equating the sum of all branch currents entering that node to zero. The resultant nodal equations are put into matrix form and solved.

Chung-Wen Ho et al., The Modified Nodal Approach to Network Analysis, *IEEE Transactions on Circuits*, Vol. Cass-22, No. 6, Jun. 1975, which is herein incorporated by reference, notes that circuit simulators, which use classic nodal formulation methods, treat voltage sources inefficiently and are incapable of including either linear or non-linear current-dependent elements. Ho et al. discloses a modified nodal approach which attempts to improve efficiency by assigning to node branches containing such elements additional branch current variables and formulating corresponding branch constitutive relations as additional system equations. For a circuit not containing voltage sources or current-dependent elements, no new variables are introduced and the modified nodal formulation method is reduced to classic nodal formulation.

Other computer-aided circuit simulators, such as MOSART, which is described by Carlin et al., On Partitioning for Waveform relaxation Time-Domain Analysis of VLSI Circuits, *IEEE*, 1984, and is herein incorporated by reference, have attempted to improve electrical circuit efficiency by using partitioning techniques which partition large electrical circuits into smaller, sub-circuits which are easier to handle. Each sub-circuit is then analyzed over the entire time interval of the simulation.

Electrical or thermal modeling of electrical circuit networks often involves large passive RC networks which are often represented by thousands of equations which must be solved simultaneously. Popular circuit simulators, such as SPICE or ASTAP, use either modified nodal or hybrid tableau formulation to form a system matrix or matrices representative of the electrical circuit. Attempts to analyze such networks with such circuit simulators require extensive computer run time or excessive data storage requirements, or both. These drawbacks result because these simulators assume that the system matrix is arbitrary and use a general matrix solution method, such as Gaussian elimination, or the like, to solve the matrix. As a general rule, the system matrix or matrices formed by these simulators is arbitrary, and more particularly, they are not positive-definite symmetric.

ASTAP is based on the Hybrid Tableau circuit analysis and therefore can never produce a symmetric system matrix. SPICE uses modified nodal formulation; however, if a non-linear voltage or current source is present in the circuit, then the resultant system matrix is not symmetric.

All of the above mentioned computer-aided circuit simulators produce a system matrix or matrices which are arbitrary, and subsequently solved by some general matrix solving technique.

SUMMARY OF THE INVENTION

It is an object of the present invention to provide a computer-aided electrical circuit simulation method which combines circuit partitioning and modified nodal formulation to formulate positive-definite symmetric system matrices which are solved using conjugate-gradient solution methods which are known to be extremely efficient for solving matrices of this type.

Briefly, this invention contemplates a method for computer aided simulation of large electrical circuits by partitioning to form sub-circuits that contain only passive elements, i.e. resistors, capacitors, and independent current sources. Such sub-circuits can be expressed as matrices that are inherently positive-definite symmetric. Modified nodal formulation is then applied to the sub-circuits. For the sub-circuits which contain only passive elements, modified nodal formulation reduces to classic nodal formulation which further expedites the process since no new variables or equations need to be introduced. Finally, a conjugant-gradient solution method is applied to solve those sub-matrices which are positive-definite symmetric. Conjugate-gradient solution methods are extremely efficient for solving matrices of this type.

BRIEF DESCRIPTION OF THE DRAWINGS

The foregoing and other objects, aspects and advantages will be better understood from the following detailed description of a preferred embodiment of the invention with reference to the drawings, in which:

FIG. 2a is a simple electrical circuit;

FIG. 2b is the system matrix for the circuit shown in FIG. 1a;

FIG. 3a is a simple electrical circuit containing an independent voltage source;

FIG. 3b is the system matrix for the circuit shown in FIG. 3a;

FIG. 4a is the circuit shown in FIG. 3a being partitioned into sub-circuits according to the present invention;

FIG. 4b is the system matrix for sub-circuit 1 shown in FIG. 4a;

FIG. 4c is the system matrix for sub-circuit 2 shown in FIG. 4a;

DETAILED DESCRIPTION OF A PREFERRED EMBODIMENT OF THE INVENTION

Figure 1A:
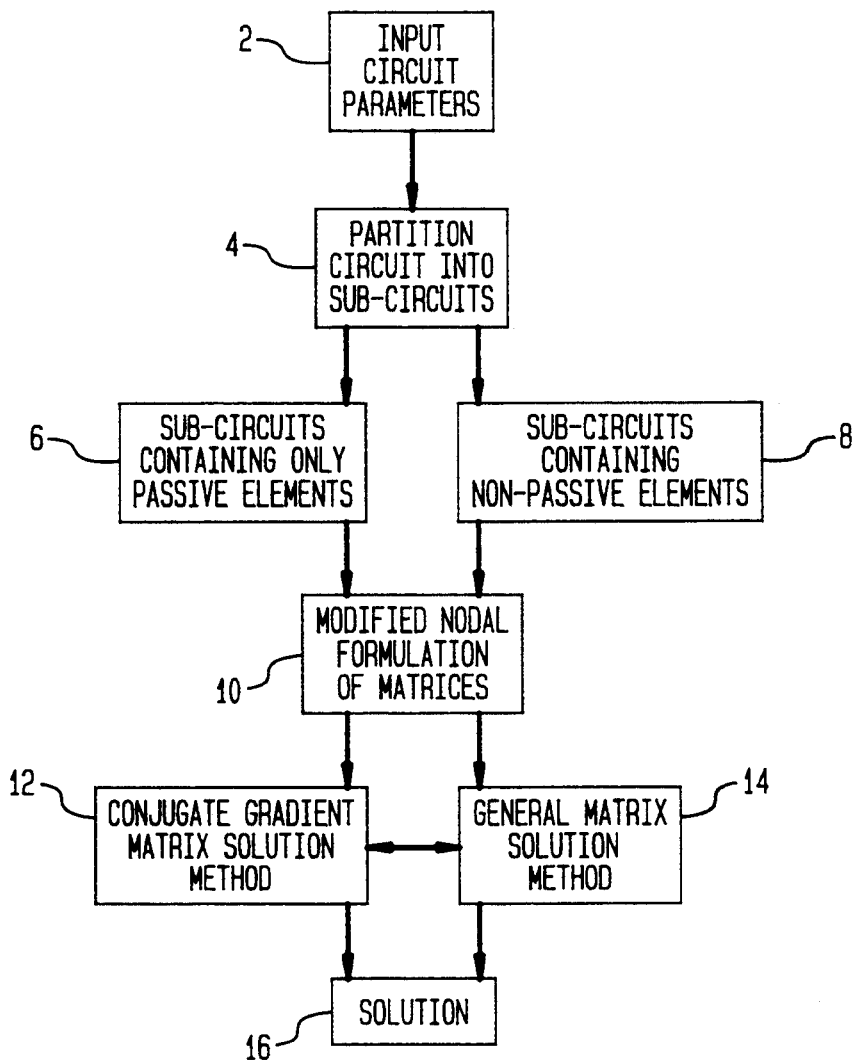
FIG. 1A is a flow diagram illustrating the present method.

Referring now to the drawings, and more particularly to FIG. 1, there is shown a flow diagram in block form illustrating the steps to efficiently analyze a large electrical circuit using the present method. It is noted that such circuits often contain thousands of electrical components. The appropriate circuit parameters needed to analyze the circuit are input into a computer at step 2 in a conventional manner. This can entail assigning each node within a circuit a number, and keying in lines of code describing nodal connections. Alternatively, graphics-type input programs are commercially available wherein the electrical circuit is actually drawn and displayed on the computer screen.

The circuit is partitioned at step 4 into a plurality of sub-circuits. Various computer implemented circuit partitioning schemes are known in the art such as those discussed by Carlin et al., cited above. It is, of course, also possible to partition the circuit into desired subcircuits on the basis of a visual inspection of the circuit diagram and enter the thusly partitioned circuit data manually into the computer system. The partitioning algorithm or rule of this invention identifies at step 6 sub-circuits which contain only passive elements, i.e. resistors, capacitors and independent current sources. Non-passive, or current dependent elements within the circuit, are partitioned into separate sub-circuits in step 4 and identified in step 6. Very complicated components, such as non-linear transistors can be modeled and circuit partitioning can be used to isolate the bulk of the passive network from the rest of the model. This technique is discussed in J. K. White et al., "Relaxation Techniques for the Simulation of VLSI Circuits, *Kluwer Academic Publishers*, Norwell Mass., 1987.

At step 10, a modified nodal formulation is applied to each of the sub-circuits identified in step 6 and each of the subcircuits identified in step 8 in order to form a matrix for each identified subcircuit. It should be noted that for those sub-circuits, identified in step 6, containing only passive circuit elements, the modified nodal formulation reduces to classic nodal formulation and the resultant matrices will be positive-definite symmetric. At step 12 conjugate-gradient solution method is applied. This is known to be an extremely efficient method for solving these particular types of matrices.

The modified nodal formulation applied in step 10 to the sub-circuits which contain current dependent elements identified in step 8 will not produce positive-definite symmetric matrices but rather arbitrary matrices which are solved at step 14 by a general solution method.

The sub-circuit solutions are combined at step 16 to yield a solution for the entire circuit. An iteration technique is then used to substitute preliminary matrix solutions back and forth between steps 12 and 14 until convergence is reached and yields a solution at step 16.

Figure 1B:
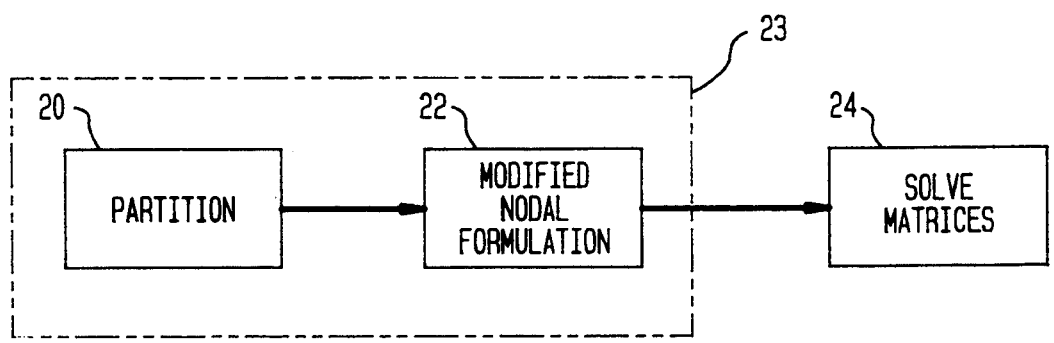
FIG. 1B is a block diagram showing computer implementation of the present method.

As can be appreciated by those skilled in the art, a computer running an appropriate program can easily perform the steps outlined in FIG. 1A. Specifically, as shown in FIG. 1B, a standard PC or mainframe computer can be used to partition a circuit, block 20, formulate matrices using modified nodal formulation methods, block 22, and solve the thusly formed matrices, block 24, all according to the teachings of the present invention. In some applications it may be advantageous to partition a circuit, block 20, and then formulate matrices, block 22, using a PC or smaller computer, block 23. The final step of solving the matrices, block 24, is typically more time consuming, and may be better implemented by a larger or high-speed mainframe computer since, expensive mainframe CPU (central processing unit) time is greatly reduced by the present invention.

FIG. 2a a simple electrical circuit containing an independent current source $J_s$, and resistors $R_1$, $R_2$, and $R_3$. The voltages at each of the circuit nodes is designated as $N_1$, $N_2$, and $N_3$. With this example, no circuit partitioning is necessary, since there are no elements contained within the circuit which would cause the system matrix to be anything other than positive-definite symmetric.

FIG. 2b shows system matrix for the circuit shown in FIG. 2a. The system matrix is formulated using modified nodal formulation, which for reasons discussed above, is reduced to classic nodal formulation due to the absence of voltage sources or current dependent devices. The voltage at each node $N_i$ within the circuit is solved for by equating the sum of all branch currents entering that node to zero and putting in the form:

$$AX = Y$$

wherein in the A matrix contains the conductances or admittances of the circuit components (i.e. $G = 1/R$); X is the unknown node voltage vector; and Y is the current vector. Capacitors may also be present, in this case, $G_i$ would be replaced by $C_i/h$, where $C_i$ are the capacitor values and h is a time step, see Ho et al, which is cited above.

In the absence of any voltage sources or current dependent devices the A matrix is positive-definite symmetric and, therefore is most efficiently solved by a computer using a conjugant-gradient method, especially for a large A matrix.

The conjugate-gradient method was developed by, and set forth in, M. R. Hestenes and E. Stiefel, Methods of Conjugate Gradients for Solving Linear Systems, *NBS J. Res.*, 49 (1952). 409–436, which is herein incorporated by reference. Variations of the basic algorithm have been developed over the years. Giuseppe Radicati di Brozolo et al., Conjugate Gradient Subroutines for the IBM 3090 Vector Facility, *IBM J. Res. Develop.*, vol. 33, No. 2, March, 1989 shows several such variations. This article is also incorporated by reference. The basic conjugate gradient method is implemented as follows:

Given A, a symmetric and positive-definite matrix of order n, and a vector Y, the conjugate gradient method is an iterative method for solving a system of linear equations $AX = Y$. Given a suitable approximation to the solution $X_0$ (choose $X_0 = 0$), set $$r_0 = Y - AX_0,$$

and $$p_0 = r_0;$$

end do for $i = 0, 1, 2, 3, \ldots$ until convergence $$\alpha_i = (r_i, r_i)/(p_i, Ap_i),$$

$$X_{i+1} = X_i + \alpha p_i,$$

$$r_{i+1} = r_i - \alpha Ap_i,$$

$$\beta_{i+1}=(r_{i+1},r_{i+1})/(r_i,r_i),$$

$$p_{i+1}=r_{i+1}+\beta_{i+1}p_i,$$

end do.

di Brozolo et al. discusses ways the algorithm can be effectively accelerated by various preconditioning strategies. Many variations of the conjugate gradient method may be implemented in the practice of the present invention.

FIG. 3a shows an electrical circuit similar to the circuit shown in FIG. 2a except that the independent current source $J_s$, has been replaced with independent voltage source $E_s$. Using modified nodal formulation to model the circuit, the branch current variable $I_E$ is introduced. FIG. 3b shows the resulting non-symmetrical arbitrary system A matrix which must be solved using a general solution method which is likely to be inefficient for this particular system.

Figures 4A, 4B, 4C:
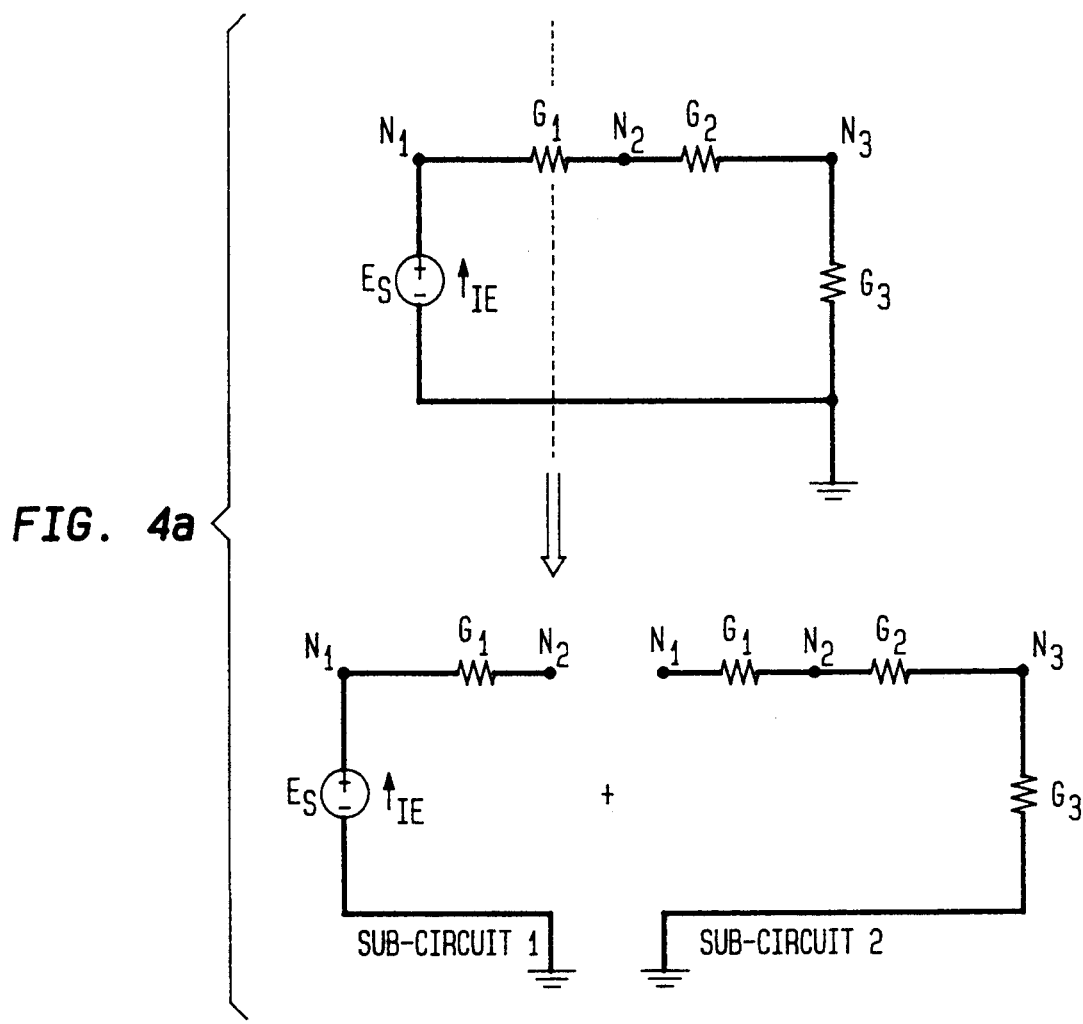

FIG. 4a shows the same circuit as shown in

FIG. 3a being partitioned into sub-circuit 1 and sub-circuit 2, according to the teaching of the present invention. The circuit is partitioned such that the bulk of the passive (i.e. RC) network, in sub-circuit 2, is isolated from the part of the circuit containing the voltage source. As mentioned above, this partitioning can be accomplished by inspection even for large circuits. Modified nodal formulation is preformed on both sub-circuit 1 and sub-circuit 2; however, in the case of sub-circuit 2, this is reduced to classic nodal formulation due to the non-current dependent nature of the elements contained therein. It is noted that it is also possible to partition the matrix after the modified nodal formulation is performed, to obtain the desired sub-system matrices, rather than partitioning the circuit prior to performing modified nodal formulation.

FIG. 4c shows the system A matrix for sub-circuit 2, of FIG. 4a, which is positive-definite and symmetric and conjugate gradient methods are used to efficiently solve the system.

FIG. 4b shows the system A matrix for sub-circuit 1, of FIG. 4a, which formed using modified nodal formulation which, of course, due to the voltage source is not positive-definite symmetric. Node $N_2$ is flagged as an external node to sub-circuit 1 and is put directly in the y vector and used as an external input.

The solution to the system shown in FIG. 4a will iterate between sub-circuit 1 and sub-circuit 2 until convergence is reached. The iterations can be done in the spirit of "waveform relaxation" where $N_2$ is initially assumed 0 and sub-circuit 1 is solved for an initial $N_1$. $N_1$ is used to initially solve for $N_2$ in sub-circuit 2, which is substituted back into sub-circuit 1, and so on.

Figure 5:
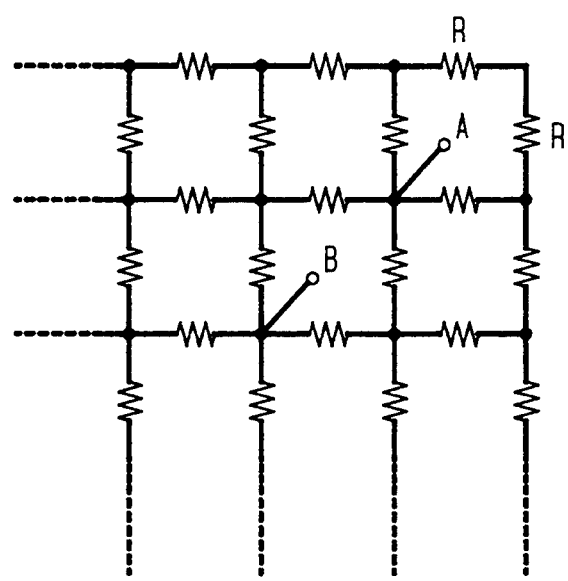
FIG. 5 is a resistive grid.

The present invention was validated by means of a test comparing the time to analyze the resistive circuit grid shown in FIG. 5 where either a voltage source or a constant current source is connected between nodes A and B. The test compared a general circuit simulator, such as ASTAP, which does not perform circuit partitioning and uses a general solution method to solve the resulting matrix, and the same general circuit simulator modified in accordance with the teachings of the present invention. The modified circuit simulator partitioned the circuit grid according to passive elements and applies modified nodal analysis to each partition. Conjugate-gradient method is applied to all resultant positive-definite symmetric matrices, and a suitable matrix solver that employs LU factorization is used to solve all resultant arbitrary matrices.

TABLE 1

| No. of Nodes | No. of Resistors | General Circuit Simulator | Modified Circuit Simulator |
|---|---|---|---|
| 100 | 180 | 0.048 | 0.042 |
| 2500 | 4,900 | 2.584 | 1.985 |
| 6400 | 12,640 | 12.90 | 7.725 |
| 10,000 | 19,800 | 28.078 | 13.495 |
| 22,500 | 44,700 | 123.059 | 44.194 |

TABLE 2

| No. of Nodes | No. of Resistors | General Circuit Simulator | Modified Circuit Simulator |
|---|---|---|---|
| 100 | 180 | 0.076 | 0.0 |
| 2500 | 4,900 | 21.03 | 0.0 |
| 6400 | 12,640 | 111.0 | 0.0 |
| 10,000 | 19,800 | 272.0 | 0.0 |
| 22,500 | 44,700 | 1102.77 | 0.0 |

TABLE 3

| No. of Nodes | No. of Resistors | General Circuit Simulator | Modified Circuit Simulator |
|---|---|---|---|
| 100 | 180 | 1,143 | 276 |
| 2500 | 4,900 | 73,368 | 7,396 |
| 6400 | 12,640 | 241,760 | 19,036 |
| 10,000 | 19,800 | 420,683 | 29,796 |
| 22,500 | 44,700 | 1,186,981 | 61,196 |

Table 1 shows the CPU time in seconds on an IBM-3090 computer in solving for the DC voltage distribution when a constant current source is used such as is illustrated in FIG. 2. The modified circuit simulator, modified in accordance with the teachings of the present invention, runs significantly faster than the unmodified version, especially when the number of circuit nodes increases. Table 2 shows the CPU time in seconds during the input phase for reordering and manipulating the matrix. Again, the modified version does not require preliminary manipulations since it is already in the proper form, i.e. positive-definite symmetric. Table 3 shows the number of non-zero matrix entries. The modified circuit simulator produces sparse matrices having many zeros, which reduces computer memory storage requirements. The storage requirements required to implement the present method are even further reduced since the matrices are symmetric and therefore, only half of the matrix needs to be used. In addition, no non-zero fill-ins are created when the conjugate gradient method is used. Fast convergence was also noted because of the strong diagonals of the matrices.

While the method and system described herein are described in terms of electrical circuit simulation, this same idea may be applied to design in other Engineering fields. For Example, the method of the present invention may be applied to design of a mechanical apparatus, by segmenting the apparatus design into sub units.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. A method for designing very large scale integrated electrical circuits having passive and non-passive circuit components, comprising the steps of:

partitioning a very large scale integrated circuit into a plurality of sub-circuits using a partitioning scheme which partitions the circuit based on a passive or non-passive nature of said circuit components, at least one of said plurality of sub-circuits consisting entirely of passive circuit components;

applying modified nodal formulation to each of said plurality of sub-circuits to formulate a corresponding matrix, each of said matrices having mathematical properties determined according to said partitioning scheme; and solving each of said matrices with a specialized solution method for said mathematical properties, said matrices corresponding to sub-circuits consisting entirely of passive circuit components being positive-definite symmetric and solved by conjugate-gradient method.

2. A design system comprising:

means for partitioning a design into a plurality of sub-units according to a passive or non-passive nature of individual elements comprising said design, at least one of said sub-units consisting of passive elements;

matrix formulation means for applying modified nodal formulation to each of said sub-units and forming a corresponding matrix, matrices corresponding to sub-units consisting of passive elements being positive definite symmetric; and means for solving each for of said positive-definite symmetric matrices by a conjugate gradient method.

3. The design system of claim 2 wherein said design is a mechanical design.

4. The design system of claim 2 wherein said design is an electrical circuit design.

5. A system for designing electrical circuits, comprising:

means for partitioning an electrical circuit into a plurality of sub-circuits according to a passive or non-passive nature of individual elements comprising said design, at least one of said sub-circuits consisting of passive elements;

matrix formulation means for applying modified nodal formulation to each of said sub-circuits and forming a corresponding matrix, and matrices corresponding to sub-circuits consisting of passive elements being positive definite symmetric; and means for solving each of said positive-definite symmetric matrices by a conjugate gradient method.

* * * * *